United States Patent [19]

Barabolak

[11] Patent Number: 5,201,069

[45] Date of Patent: Apr. 6, 1993

[54] ELECTROACOUSTIC TRANSDUCER MOUNTING APPARATUS

[75] Inventor: Mark A. Barabolak, Elmhurst, Ill.

[73] Assignee: Motorola, Inc., Schaumburg, Ill.

[21] Appl. No.: 779,480

[22] Filed: Oct. 18, 1991

[51] Int. Cl.[5] .............................................. H04B 1/38
[52] U.S. Cl. ................................... 455/90; 379/429; 381/188; 381/205
[58] Field of Search .......................... 455/90, 349, 350; 361/422; 381/150, 188, 205; 379/428, 429, 433, 440

[56] References Cited

U.S. PATENT DOCUMENTS

| | | | |
|---|---|---|---|
| 3,627,930 | 12/1971 | Tolman | 379/429 |
| 4,124,785 | 11/1978 | Seretny et al. | 379/429 |
| 4,796,288 | 1/1989 | Busche et al. | 381/188 |
| 4,984,268 | 1/1991 | Brown et al. | 379/433 |

FOREIGN PATENT DOCUMENTS 746788 4/1977 U.S.S.R. .
1584960 12/1976 United Kingdom .

*Primary Examiner*—Reinhard J. Eisenzopf
*Assistant Examiner*—Andrew Faile
*Attorney, Agent, or Firm*—Kevin D. Kaschke; Raymond A. Jenski; John Fisher

[57] ABSTRACT

In an exemplary embodiment, a communication device, such as a radiotelephone (100), has within its housing (106) an apparatus for electrically coupling an electroacoustic transducer (201), such as an earpiece, to radiotelephone circuitry (403). The apparatus comprises resilient conductive means, for example conductive barrel springs (213-216), abutting both the conductive contacts on the earpiece (214, 243) and the corresponding conductive contacts on a printed circuit substrate (205, 208, and 206, 207). A bracket (211) manually attached to the printed circuit substrate (203) positions the conductive barrel springs (213-216) while they are compressed between the earpiece (201) and the printed circuit substrate (203) during the assembly of the radiotelephone (100). A plurality of barrel springs (213-216) are used to provide redundant electrical coupling and stability for the earpiece (201). The apparatus advantageously provides for improved manufacturability and convenient replaceability of the earpiece (201).

17 Claims, 2 Drawing Sheets

ELECTROACOUSTIC TRANSDUCER MOUNTING APPARATUS

FIELD OF THE INVENTION

The present invention relates generally to communication devices, and more particularly to apparatus providing electrical coupling between an electroacoustic transducer and a printed circuit substrate in the communication device.

BACKGROUND OF THE INVENTION

Communication devices are presently being extensively utilized in a wide range of applications. Communication devices typically include a microphone and an earpiece enabling a user to send or receive audible messages, respectively. The microphone is generally described as a transmit electroacoustic transducer that converts acoustic signals into electrical signals. The earpiece is generally described as a receive electroacoustic transducer that converts electrical signals into acoustic signals.

Manufacturing the communication device requires a means for coupling the electrical signals from the electroacoustic transducers to the communication device's circuitry. A widespread approach to couple the electrical signals is conventional wire. Usually, the wire is either hand soldered or provided with connectors to make an electrical connection to the electroacoustic transducers and the circuitry. This approach is labor intensive and costly. Furthermore, the electroacoustic transducer cannot be easily replaced without detaching the wire.

Another approach used to couple electrical signals is a combination of wire with leaf springs. The wire provides electrical coupling between the circuitry and the leaf spring. The leaf spring provides electrical coupling between the wire and the electroacoustic transducer. The advantage of this approach is that the electroacoustic transducer can easily be replaced without using any tools. The disadvantage of this approach is that a connection is still made at both ends of the wire and the addition of the leaf springs. Thus, the advantage gained of an easily replaceable electroacoustic transducer is offset by the added expense and labor associated with incorporating the leaf springs. By way of physical example, this approach may be found in a conventional desk top telephone sold by Comdial Inc., Charlottesville, Va. 22906, model number SN 2880341.

For many communication devices, the prior art has not produced an apparatus to electrically couple electroacoustic transducers to the communication device circuitry to meet the difficult requirement of convenient electroacoustic transducer replaceability while providing for the advantage of improved manufacturability.

SUMMARY OF THE INVENTION

An apparatus is provided for mounting an electroacoustic transducer in a housing. A printed circuit substrate has a surface including a first and a second conductive contact disposed thereon. A side of the housing has at least one hole extending through the housing. The electroacoustic transducer has a first side providing an electroacoustic interface and is disposed essentially opposite the hole, and a second side having a first and a second conductive contact. A means for sealing the first side of the electroacoustic transducer to the housing is provided. A first resilient conductive means abuts both the first conductive contact on the printed circuit substrate and the first conductive contact on the electroacoustic transducer. A second resilient conductive means abuts both the second conductive contact on the printed circuit substrate and the second conductive contact on the electroacoustic transducer whereby the first and the second resilient conductive means are compressed when the printed circuit substrate is assembled into the housing.

DETAILED DESCRIPTION OF A PREFERRED EMBODIMENT

Figure 1:
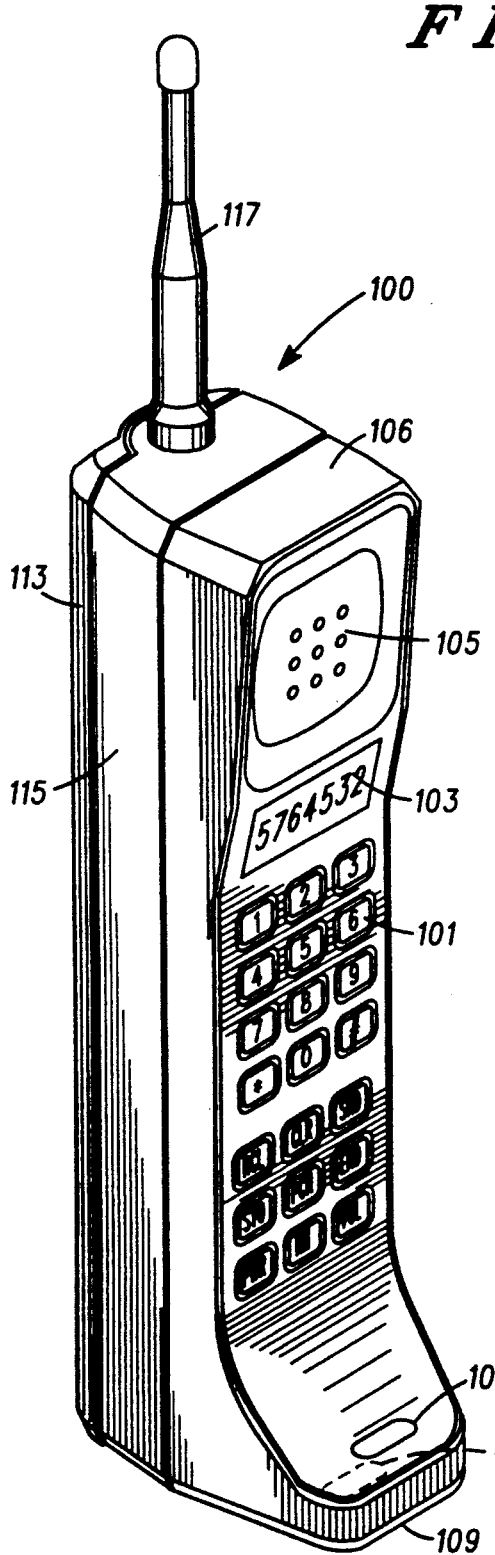
FIG. 1 is a perspective view of a communication device which may incorporate an apparatus in accordance with the teachings and principles of the present invention.

FIG. 1 is a perspective view of a communications device to which the present invention may be applied. By way of example, the communication device is a portable radiotelephone generally indicated by reference numeral 100. The radiotelephone 100 may have a design similar to the design described in U.S. Pat. No. Des. 315,346, entitled "Portable Radiotelephone or Similar Article", designed by Albert L. Nagele, issued on Mar. 12, 1991, and assigned to the assignee of the present invention. The radiotelephone 100 is of a size to be conveniently held in one hand while a keypad generally indicated at reference numeral 101 is manually actuated by means of one or more fingers of the other hand. By way of example, a full description of the circuitry used to operate the radiotelephone 100 may be found in an Instruction Manual 68P81071E55-O for the Dyna TAC Cellular Portable Telephone, available from C and E Parts, Motorola Inc., 1301 E. Algonquin Rd., Schaumburg, Ill. 60195.

Characters entered by means of the keypad 101 are displayed on a panel 103 under the control the radiotelephone circuitry. The radiotelephone 100 has such a length that a user may listen to received audio signals through holes at one end of a front housing 106 generally indicated by reference numeral 105 and may speak audio signals into a hole at the other end of the front housing 106 generally indicated by reference numeral 107. The bottom side of the front housing 109 includes a hole generally located by reference numeral 111 through which audio signals are passed to alert the user to an incoming call.

A battery pack assembly 113, supplying power to the radiotelephone's circuitry, is removeably attached to the rear housing portion of the radiotelephone 115. The battery pack assembly 113 may comprise rechargeable nickel-cadmium battery cells.

Communication signals are transmitted from and received by the communication device via an antenna 117. The size and weight of the radiotelephone 100 including the battery pack assembly 113 is such that the radiotelephone 100 may be hand carried.

Figure 2:
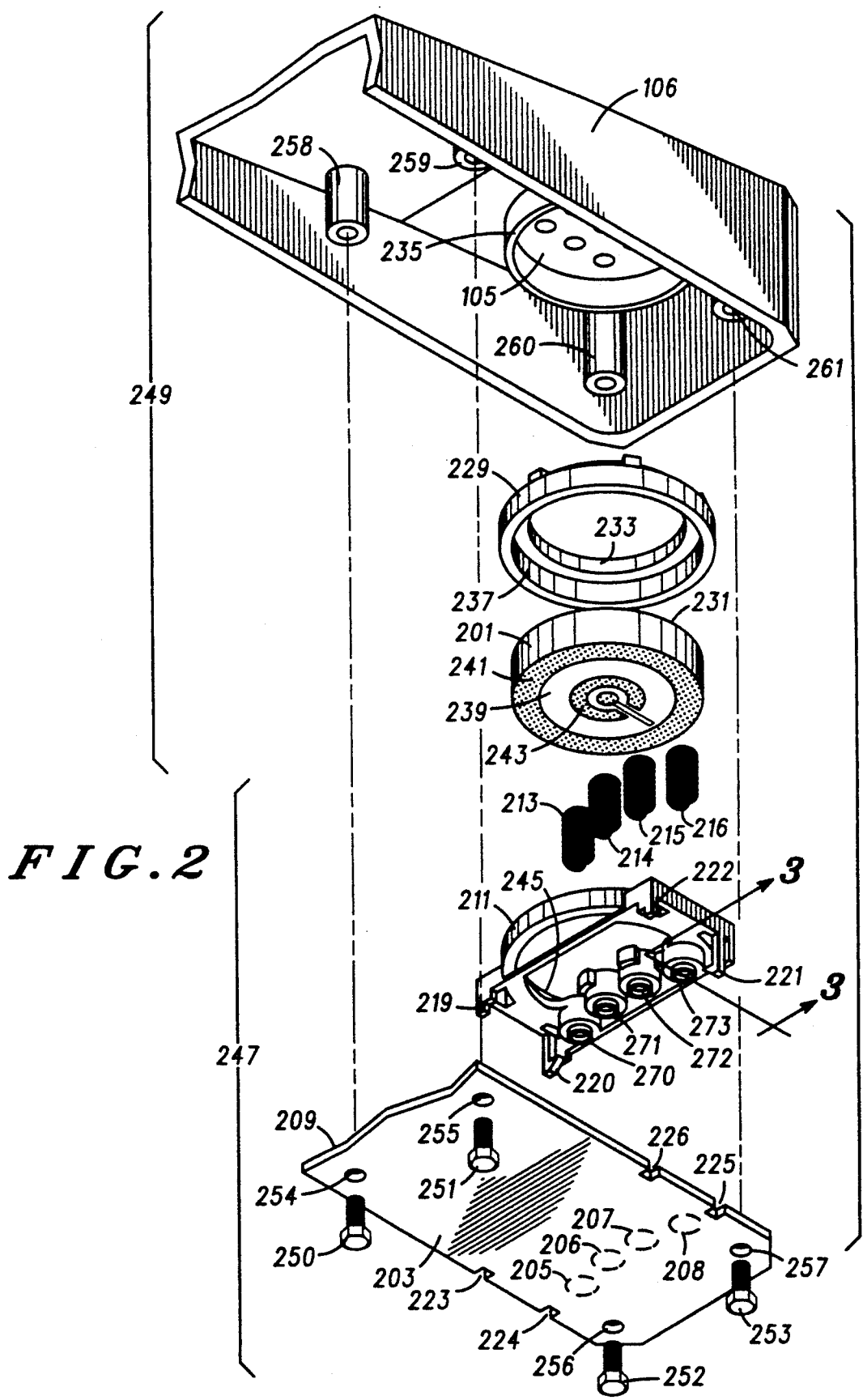
FIG. 2 is a partial perspective exploded view of the communication device of FIG. 1 showing the apparatus in accordance with the teachings and principles of the present invention.

FIG. 2 is a partial perspective exploded view of the communication device of FIG. 1 showing the apparatus in accordance with the teachings and principles of the present invention. A novel feature of FIG. 2 shows an electroacoustic transducer, such as an earpiece 201, electrically coupled to a printed circuit substrate 203 via a plurality of resilient conductive means, such as conductive barrel springs 213–216.

The printed circuit substrate 203 has four conductive contacts 205, 206, 207 and 208 disposed on its surface 209. A bracket 211 having cylindrical holes 270, 271, 272 and 273 provides means for positioning the four conductive barrel springs 213, 214, 215 and 216, respectively.

The bracket 211 has two snaps 220 and 221 providing means for attaching the bracket 211 to corresponding cutouts 224 and 225 on the printed circuit substrate 203. The bracket 211 also has two legs 219 and 222 positioned within corresponding cutouts 223 and 226 on the printed circuit board 203. The cutouts 223–226 are located on the printed circuit substrate 203 such that the four barrel springs 213–216 are laterally disposed above the conductive contacts 205–208, respectively, on the surface of the printed circuit substrate 209.

By way of example, the printed circuit substrate 203 may be Nema Grade FR-4 Laminate conventionally used in the electronics industry.

Figure 3:
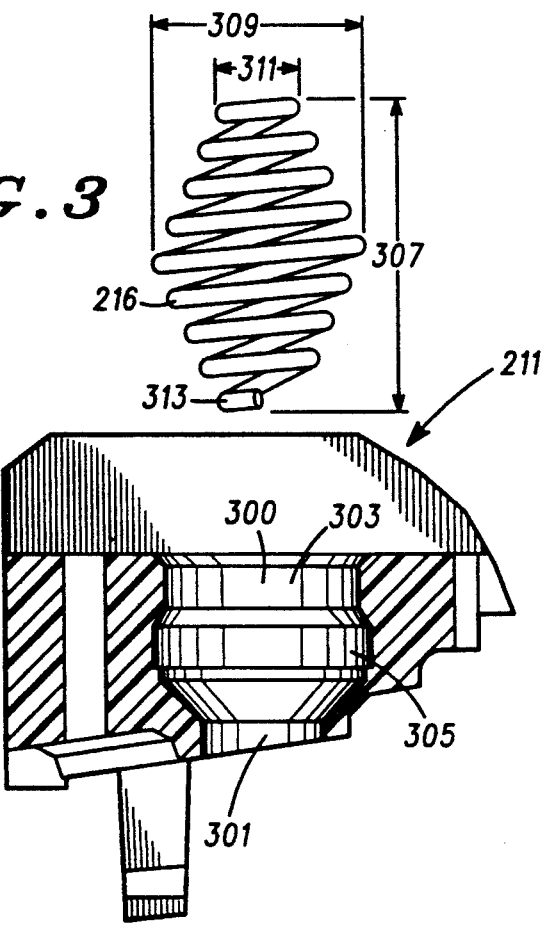
FIG. 3 is a partial enlarged cross-sectional view of the bracket of FIG. 2 showing the aperture for positioning a barrel spring of FIG. 2.

The bracket 211 is constructed of a material that is insulating and durable, for example 13% glass fiber reinforced nylon 6/6. A detailed description of how the cylindrical holes 270–273 in the bracket 211 captivate the conductive barrel springs 213–216, respectively, is shown in FIG. 3.

A gasket 229 provides a means for sealing and locating a front side of the earpiece 231 to the front housing 106. The gasket 229 includes a raised rim 233 that fits inside a corresponding molded rim 235 on the inside of the front housing 106. The raised rim 233 provides the means for acoustically sealing the earpiece 210 to the front housing 106. The front side of the earpiece 231 is of such a diameter that it fits within a recessed rim 237 on the gasket 229. The recessed rim of the gasket 237 in combination with the molded rim on the front housing 233 provides the means for locating the front side of the earpiece 231 essentially opposite the holes at 105 in the front housing 106. The raised rim 233 also separates the front side of the earpiece 231 from the front housing 106 to create an acoustic chamber for the earpiece 210.

A back side of the earpiece 239 includes at least two conductive contacts 241 and 243 enabling electrical signals to be coupled to the earpiece 201. By way of the manufacturer's design, the conductive contacts 241 and 243 are shown in a concentric circular arrangement. One conductive contact 241 is a continuous circular conductive contact. The other conductive contact 243 is a discontinuous circular conductive contact. The discontinuity of the conductive contact 243 generates a requirement to have redundant electrical coupling between the printed circuit substrate 203 and the earpiece 201 if the earpiece is allowed to be place in any rotational position.

The bracket 211 positioning the four conductive barrel springs 213–216 above the printed circuit board 203 comprises a board subassembly 247. The earpiece 201, the gasket 229 and the front housing 106 comprises a housing subassembly 249. The board subassembly 247 may be handled independently of the housing subassembly 249 to advantageously allow for freedom of motion during the assembly of the communication device 100. The board subassembly 247 is placed over the front housing subassembly 249 such that a semi-circular rim 245 on the bracket 211 is disposed on the circumference of the back side of the earpiece 239. Conductive barrel springs 214 and 215 are disposed opposite two portions of the conductive contact 243 on the back side of the earpiece 239. Conductive barrel springs 213 and 216 are disposed opposite two portions of the conductive contact 241 on the back side of the earpiece 231.

The conductive barrel springs 213–216 have such a length that they are compressed between the printed circuit substrate 203 and the back side of the earpiece 239 providing reliable electrical coupling therebetween when the printed circuit substrate 203 is assembled into the front housing 106. By way of example, the means for compressing is accomplished using four screws 250, 251, 252 and 253 to secure the printed circuit substrate 203 to the front housing 106. The four screws 250–253 extend through corresponding holes 254, 255, 256 and 257 in the printed circuit substrate 203, into corresponding boss receptacles 258, 259, 260 and 261 to draw the printed circuit substrate 203 and the front housing 106 together.

When compressed the conductive barrel springs 213–216 abut both the conductive contacts (205–208) on the printed circuit substrate (203) and the corresponding conductive contacts 241 and 243 on the earpiece (201) at their conical end portions. When abutted and compressed, the conductive barrel springs 213–216 electrically connect to the conductive contacts. An abutting interconnection between the printed circuit substrate and the earpiece conductive contacts advantageously eliminates the need for a soldered connection therebetween.

Barrel springs 214 and 215 redundantly couple electrical signals between corresponding conducting contacts 206 and 207 on the surface of the printed circuit substrate 209 and the conductive contact 243 on the back side of the earpiece 239. Barrel springs 213 and 216 redundantly coupled electrical signals between corresponding conductive contacts 205 and 208 on the surface of the printed circuit substrate 209 and the conductive contact 241 on the back side of the earpiece 239. Thus, electrical coupling is provided between the printed circuit substrate 203 and the earpiece 201 for any rotational position of the earpiece 201.

By way of example, the gasket may be made of Santoprene 211-45 thermoplastic rubber having a hardness factor of about 45 durometer shore A.

By way of example, the earpiece 210 may be a piezoelectric ceramic receiver supplied by Primo Inc., Japan under part number CR-5C.

Any type of electroacoustic transducer may employ the present invention including a microphone and a ringer alert as well as the earpiece 210.

The manufacturing advantages gained in using this apparatus comprise eliminating hand soldering of conventional lead wires and the potential for the lead wires to get pinched during assembly, and repeatability of electrical coupling. The serviceability advantages gained by employing this apparatus comprise convenient and fast replaceability of the earpiece 201 if it should become defective.

In FIG. 2 the back side of the earpiece 239 is in a non-parallel position relative to the surface of the printed circuit substrate 209. A particularly advantageous feature of the present invention is that the conductive barrel springs 213–216 are able to provide reliable electrical coupling between opposing non-parallel conductive contacts on the back side of the earpiece 239 and the surface of the printed circuit substrate 209.

FIG. 3 is a partial enlarged cross-sectional view of the bracket of FIG. 2 showing an essentially cylindrical hole generally indicated by reference numeral 300, for positioning the conductive barrel spring 216 of FIG. 2. The aperture 300 is generally characterized by a small diameter 301, a medium diameter 303, and a large diameter 305. The conductive barrel spring 216 is inserted through the medium diameter 303. The widest spiral diameter of the barrel spring 309 is larger than the medium diameter 303 and somewhat interferes with the medium diameter 303. The barrel spring 213 is forced through the medium diameter 303 such that the wide portion of the barrel spring 309 is disposed within the wide diameter 305. Thus, the barrel spring 213 becomes captivated by the cylindrical hole in the bracket 300.

The small diameter 301 confines one end of the barrel spring 313 above the conductive contact 205 on the surface of the printed circuit substrate 209. The small diameter 301 prevents the one end of the barrel spring 313 from wandering across the printed circuit substrate 209 and making an unintentional electrical connection to lead traces or component leads (not shown) adjacent to the conductive contact 205.

By way of example, the conductive barrel springs 213–216 are made of spring tempered wire, grade A phosphor bronze per the American Society of Testing Materials (ASTM) Standard B159. The surface of the spring wire has a 150 micro-inch thick tin coating. The spring wire is coiled eight times to form the conductive barrel spring having a free height of 7.6 mm 307 whereby the outside diameter of the center coils 309 is 4.4 mm and the outside diameter of the end coils 311 is 2.2 mm to form a conical shape at each end. The force produced by such a barrel spring is about 275 grams under a load created by compressing the conductive barrel spring from 7.6 mm to 4.5 mm. Conductive barrel spring are advantageously utilized in this application because the conical end portions of the barrel spring, under compression, generate a concentrated force on the conductive contacts of the earpiece and the printed circuit substrate to provide reliable electrical coupling.

Other resilient conductive means may be used in place of the conductive barrel springs 213–216 such as conventional conductive elastomeric connectors or conductive rubber. The durometer, i.e. hardness, and the conductivity of the conductive elastomeric connectors or the conductive rubber may be chosen so that reliable electrical coupling can be made.

I claim:

1. Apparatus for mounting an electroacoustic transducer in a housing, the apparatus comprising:
    a printed circuit substrate having a surface including a first and a second conductive contact disposed thereon;
    a side of the housing having at least one hole extending through the housing;
    a first and a second side of the electroacoustic transducer, the first side providing an electroacoustic interface and disposed essentially opposite the hole, the second side having at least a first and a second conductive contact;
    means for sealing the first side of the electroacoustic transducer to the housing;
    first resilient conductive means abutting both the first conductive contact on the printed circuit substrate and the first conductive contact on the electroacoustic transducer; and
    second resilient conductive means abutting both the second conductive contact on the printed circuit substrate and the second conductive contact on the electroacoustic transducer whereby the first and the second resilient conductive means are compressed when the printed circuit substrate is assembled into the housing.

2. The apparatus in accordance with claim 1 further comprising means for locating the electroacoustic interface essentially opposite the hole.

3. The apparatus in accordance with claim 1 further comprising means for positioning the first and the second resilient conductive means between the surface of the printed circuit substrate and the second side of the electroacoustic transducer.

4. The apparatus in accordance with claim 1 wherein the first and the second resilient conductive means further comprise a first and a second conductive barrel spring, respectively, each having a plurality of coils and a first and a second end, the coils at the center having a diameter greater than the coils at the first and second end.

5. The apparatus in accordance with claim 1 further comprising means for compressing the first and the second resilient conductive means between the printed circuit substrate and the electroacoustic transducer.

6. The apparatus in accordance with claim 1 wherein the surface of the printed circuit substrate and the second side of the electroacoustic transducer are disposed in nonparallel planes.

7. The apparatus in accordance with claim 1 further comprising a plurality of resilient conductive means, providing redundant electrical coupling, between the first and the second conductive contacts on the printed circuit substrate and the first and second contacts on the electroacoustic transducer, respectively.

8. Apparatus for mounting an electroacoustic transducer in a housing, the apparatus comprising:
    a printed circuit substrate having a surface including a first and a second conductive contact disposed thereon;
    a side of the housing having at least one hole extending through the housing;
    a first and a second side of the electroacoustic transducer, the first side providing an electroacoustic interface and disposed essentially opposite the hole, the second side having at least a first and a second conductive contact;
    means for sealing the first side of the electroacoustic transducer to the housing;
    a first conductive spring having a first and a second conical end portion abutting the first conductive contact on the printed circuit substrate and the first conductive contact on the electroacoustic transducer, respectively; and
    a second conductive spring having a first and a second conical end portion abutting the second conductive contact on the printed circuit substrate and the second conductive contact on the electroacoustic transducer, respectively, whereby the first and the second conductive springs are compressed when the printed circuit substrate is assembled into the housing.

9. The apparatus in accordance with claim 8 further comprising means for positioning the first and the second conductive springs between the printed circuit substrate and the electroacoustic transducer.

10. The apparatus in accordance with claim 8 further comprising means for compressing the first and the second conductive means between the printed circuit substrate and the electroacoustic transducer.

11. The apparatus in accordance with claim 8 wherein the surface of the printed circuit substrate and the second side of the electroacoustic transducer are disposed in nonparallel planes.

12. The apparatus in accordance with claim 8 further comprising a plurality of conductive springs providing redundant electrical coupling between the first and the second conductive contacts on the printed circuit substrate and the first and second contacts on the electroacoustic transducer, respectively.

13. A commumication device having a housing, and an electroacoustic transducer the communication device comprising:
   communication signal interface means;
   transceiving means, including a printed circuit substrate having at least a first and a second conductive contact, coupled to the interface means;
   a side of the housing having at least one hole extending through the housing;
   a first and a second side of the electroacoustic transducer, the first side providing an electroacoustic interface and disposed essentially opposite the hole, the second side having at least a first and a second conductive contact;
   means for sealing the first side of the electroacoustic transducer to the housing;
   a first resilient conductive means abutting both the first conductive contact on the printed circuit substrate and the first conductive contact on the electroacoustic transducer; and
   a second resilient conductive means abutting both the second conductive contact on the printed circuit substrate and the second conductive contact on the electroacoustic transducer, whereby the first and the second resilient conductive means are compressed when the printed circuit substrate is assembled into the housing.

14. The apparatus in accordance with claim 13 further comprising means for positioning the first and the second resilient conductive means between the printed circuit substrate and the electroacoustic transducer.

15. The apparatus in accordance with claim 13 further comprising means for compressing the first and the second conductive springs between the printed circuit substrate and the electroacoustic transducer.

16. The apparatus in accordance with claim 13 wherein the surface of the printed circuit substrate and the second side of the electroacoustic transducer are disposed in nonparallel planes.

17. The appartus in accordance with claim 13 further comprising a plurality of resilient conductive means providing redundant electrical coupling between the first and the second conductive contacts on the printed circuit substrate and the first and second contacts on the electroacoustic transducer, respectively.

* * * * *